United States Patent [19]

Bennett

[11] Patent Number: 4,637,943
[45] Date of Patent: Jan. 20, 1987

[54] SEALED SPLIT INSTRUMENT HOUSING WITH FOIL-BACKED ACRYLIC TRANSFER ADHESIVE TEARBAND

[75] Inventor: George D. Bennett, Shelburne, Vt.

[73] Assignee: Simmonds Precision, New York, N.Y.

[21] Appl. No.: 651,471

[22] Filed: Sep. 17, 1984

[51] Int. Cl.4 .......................... B60R 13/06; C09J 7/02
[52] U.S. Cl. .................................. 428/35; 156/304.1; 206/606; 428/40
[58] Field of Search .......................... 428/35, 40, 463; 206/605, 606; 156/304.1

[56] References Cited

U.S. PATENT DOCUMENTS

| | | | |
|---|---|---|---|
| Re. 24,906 | 12/1960 | Ulrich | 428/480 X |
| 2,884,126 | 4/1959 | Ulrich | 428/480 X |
| 3,051,370 | 8/1962 | Hanlon | 206/605 |
| 3,061,169 | 10/1962 | Yermakoff et al. | 206/605 |
| 3,100,760 | 8/1963 | Brown et al. | 428/422 |
| 3,108,986 | 10/1963 | Goldberg et al. | 524/539 X |
| 3,202,535 | 8/1965 | Gaynes | 428/355 X |
| 3,330,436 | 7/1967 | Slomski | 220/270 |
| 3,402,876 | 9/1968 | Kuchenbecker | 220/270 X |
| 3,403,810 | 10/1968 | Kehe | 220/270 |
| 3,426,936 | 2/1969 | Palmer | 220/270 |
| 3,925,584 | 12/1975 | Suzuki et al. | 428/40 |
| 3,972,468 | 8/1976 | Reid | 206/627 |
| 4,091,930 | 5/1978 | Buchner et al. | 206/605 |
| 4,101,698 | 7/1978 | Dunning et al. | 428/40 X |
| 4,125,739 | 11/1978 | Bow | 428/40 X |
| 4,404,246 | 9/1983 | Charbonneau et al. | 428/212 |
| 4,493,431 | 1/1985 | Cho | 220/270 X |

OTHER PUBLICATIONS

Product Information, "A10 Acrylic Adhesive Family", Scotch Joining Systems Sep. L981, 3M, St. Paul, Minn.

Primary Examiner—Henry F. Epstein
Attorney, Agent, or Firm—Cushman, Darby & Cushman

[57] ABSTRACT

A foil-backed acrylic transfer adhesive tearband structurally joins and hermetically seals a split instrument housing assembly. The tearband is formed by an acrylic transfer adhesive layer affixed to one side of a metallic foil strip layer.

16 Claims, 5 Drawing Figures

U.S. Patent    Jan. 20, 1987    4,637,943
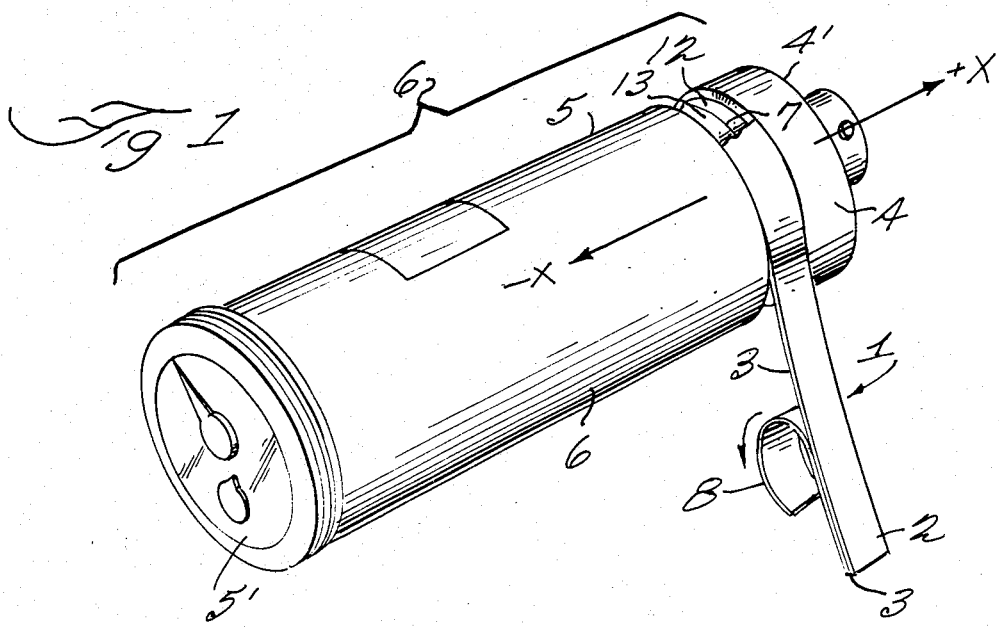
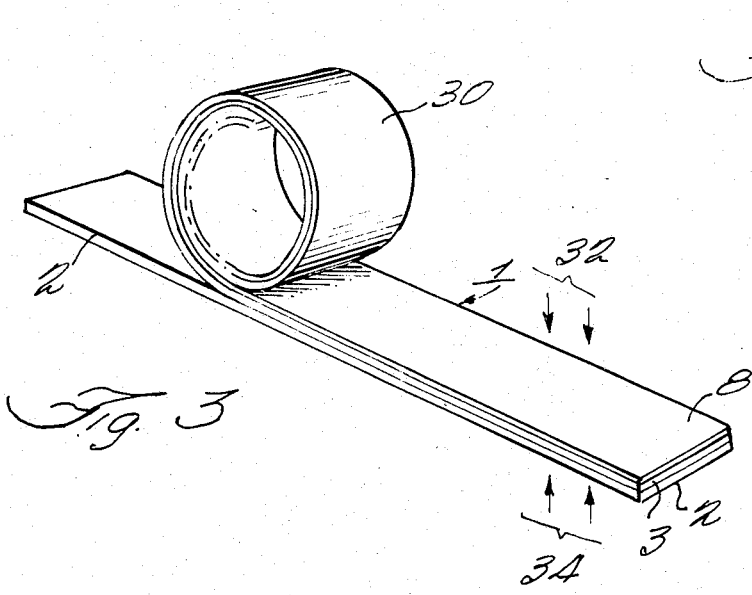
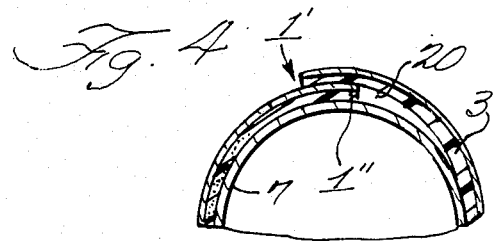
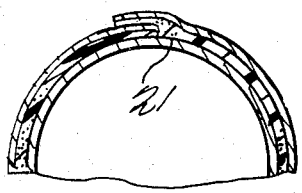
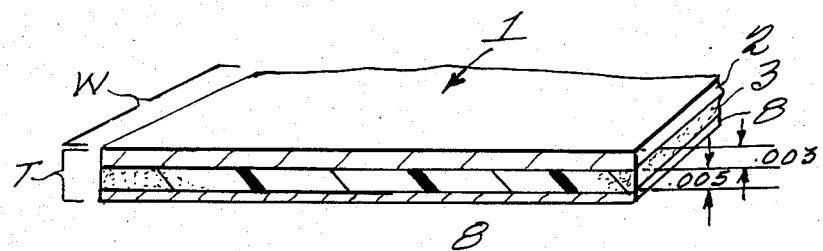

SEALED SPLIT INSTRUMENT HOUSING WITH FOIL-BACKED ACRYLIC TRANSFER ADHESIVE TEARBAND

FIELD OF THE INVENTION

The present invention relates to the structural joining and hermetic sealing of split instrument housing assemblies typically used to house electronic indicator components for use in aircraft. More particularly, it relates to a foil-backed acrylic transfer adhesive tearband for structurally joining and hermetically sealing split instrument housings without the use of conventional soldered copper sealing bands.

BACKGROUND AND SUMMARY OF THE INVENTION

The hermetic seal of airplane indicator assemblies typically must be capable of constantly withstanding a shear force of at least one atmosphere (i.e. about 15 psi acts against the internal end faces of the housing when it is in a high altitude, low pressure environment) but it must also withstand temperatures from about −65° F. to about +300° F. It must also have strong resistance to solvents such as oil and gasoline as well as other destructive forces. In the past, the only method thought to satisfy these rigid requirements was a soft copper strip soldered to a joining seam of the split instrument housing assembly. However, several problems are presented by such prior practice.

For example, the copper strip and the assembly must undergo a pretinning process in order to quickly and uniformly solder the strip to the assembly housing (e.g. using SR 63 solder). Further, soldering of the copper strip requires high temperatures necessary for melting the solder. Thirdly, indicator assemblies typically have been and are made of aluminum housings (e.g. to conserve weight), however, aluminum typically cannot be directly soldered by conventional methods. Thus, aluminum housings typically must also be pre-plated with nickel in order to be properly soldered. The added process step of nickel plating is, of course, costly and time consuming.

A further typical difficulty in the process of conventional soldered copper band sealing of split instrument housing assemblies is the use of solder flux applied to the joints to be soldered. The flux is usually a corrosive threat to the electronic components within the housing and, of course, also requires an additional process step and, typically, a final cleaning step as well.

By use of such prior soldered copper band sealing methods, electronic components within the indicator assembly could not be repaired or removed without desoldering the copper strip through the application of high temperature heat—with the attendant opportunity to permanently damage the electronic components.

Thus, the presence of corrosive flux and the necessary application of high temperature heat presents a constant danger to reliability and life time of the electronic components contained in the indicator assemblies. Moreover, as mentioned, the soldering/desoldering method is in several respects costly and time consuming.

Although split housing indicator assemblies for housing electronic components in the aviation field typically have been hermetically sealed only through the use of soldered copper bands or strips, prior patents in other fields disclose methods of sealing, and sometimes hermetically sealing, other types of containers for use in other fields. One such method is disclosed in Kehe U.S. Pat. No. 3,403,810. The Kehe patent, however, teaches hermetic sealing of a plastic container of substantially ethylene copolymer. A closure skirt also comprised of copolymer is heat sealed to the copolymer container, thus hermetically sealing the container. The Kehe technique would also require the application of heat which, as already mentioned above, is a danger to electronic components within the indicator assembly.

C. E. Palmer in U.S. Pat. No. 3,426,936 discloses a tearstrip opener for sealed foil packages. Although it is there said that the strip of material may be affixed to the package by means of an adhesive, no such adhesive is disclosed in the Palmer patent that is believed suitable for sealing aircraft indicators. Nor is the possibility of sealing aircraft indicator housings with foil-backed acrylic transfer adhesive tearbands in any way suggested.

In Slomski U.S. Pat. No. 3,330,436, a seam release container uses a strip adhesively affixed and mechanically secured by an end tab. The Slomski patent is primarily directed towards an end tab that may be more easily pulled out thus releasing the seam and opening the container and which may be suitable for high speed automated production. As in the above-referenced patents, Slomski's disclosure is not directed to the problem of hermetically sealing aircraft indicator split housing assemblies.

In summary, tearbands and seam release containers per se are known in various arts. However, none of them, excepting the present invention, suggest use of a foil-backed acrylic transfer adhesive tearband to hermetically seal a split instrument housing assembly in aviation applications.

The present invention overcomes these problems and obstacles through the use of an acrylic transfer adhesive applied to a metallic foil band which, in turn, is used as a tearband device for structurally joining and hermetically sealing split aircraft instrument housing assemblies (e.g. containing indicators, electronic equipment and the like), without using the conventional high temperature soldered copper strip but which can nevertheless continuously withstand temperatures of up to 300° F. and pressures up to one atmosphere.

Many advantages have been discovered in the use of such an acrylic transfer adhesive foil-backed tearband for this application. Such a tearband eliminates any need for solder pretinning; eliminates high solder temperatures; and eliminates any requirement for nickel plating and/or pretinning of aluminum housings. The present invention further eliminates the use of corrosive solder fluxes. Moreover, my acrylic transfer adhesive tearband can be easily and quickly installed and removed virtually an infinite number of times without damaging the nickel plated surface on aluminum housings (if present) or the aluminum housing itself. Cost savings in process and handling time of end item assemblies (and in the repair of same) are additional important features of the present invention.

It has been found that 3M brand A10 "ISOTACK" product No. Y-9469 acrylic transfer adhesive performs optimally having sufficient shear strength per unit area to permit reasonably sized tearbands designed to withstand 1 atmosphere or better of pressure differential (tending to separate the split housing) and to withstand temperatures of at least −65° F. to +300° F. Other acrylic transfer adhesives having substantially the same physical properties as the "ISOTACK" adhesive may also be employed.

The presently preferred commercially available acrylic transfer adhesive we believe is described more fully in U.S. Pat. No. Re. 24,906 to Erwin Uhlrich. The commercial product information literature includes the following:

A-10 "Isotac" adhesives may be used in general industrial applications where high bond strength, excellent temperature and solvent resistance, and outstanding shear strength properties are required.

1. Bond strength is dependent upon the amount of adhesive-to-surface contact developed. Firm application pressure develops better adhesive contact and thus improves bond strength.

2. To obtain optimum adhesion, the bonding surfaces must be clean, dry and well unified. Some typical surface cleaning solvents are isopropyl alcohol or heptane. Use proper procedures when handling solvents.

3. Ideal tape application temperature range is 70° F. to 100° F. (21° C. to 38° C.). Initial tape application to surfaces at temperatures below 50° F. (10° C.) is not recommended because the adhesive becomes too firm to adhere readily. However, once properly applied, low temperature holding is satisfactory.

4. Ultimate bond strength can be accelerated and increased by exposure of the bond to temperatures such as 150° F. (66° C.) for about 1 hour. Other heat ranges and time cycles may also be used to soften the adhesive. This provides better adhesive wetout onto the substrates.

A-10 "Isotac" acrylic adhesive is designed for applications requiring high peel and shear strength.

Also, if increased shear strength is desired, screws or shear pins or the like may be used to further resist shear forces caused by pressure differentials between the inside and outside of the hermetically sealed housing although such screws or pins are not an essential feature of the present invention.

Additionally, the metal used for the foil backing of the foil-backed acrylic transfer adhesive tearband may be the same or similar as the exterior metal surface of the split housing assembly so that both the tearband and the instrument assembly will have similar corrosive rates and/or other common physical characteristics. Presently, because of the aforementioned conventional process of soldering and the superior soldering characteristics of nickel, many assemblies in the field have housings comprised substantially of aluminum with nickel plating. For those assemblies, the metallic foil of the now described foil-backed acrylic transfer adhesive tearband should preferably comprise nickel. However, furture constructions of indicator assemblies may now eliminate the added nickel plating (since soldering will no longer be required) and, in such a case, the metallic foil of the foil-backed acrylic transfer adhesive tearband preferably comprises aluminum so as to have the same corrosive rate and/or other characteristics as the aluminum split housing assembly itself.

Importantly, the present invention may be used in current split housing assemblies for containing electronic indicator equipment.

DESCRIPTION OF THE DRAWINGS

FIG. 1 shows an exemplary split housing assembly containing indicator electronic equipment having a case assembly, end plate assembly and a foil-backed acrylic transfer adhesive tearband;

FIG. 2 is an isometric view of the presently preferred foil-backed acrylic transfer adhesive tearband itself;

FIG. 3 illustrates an exemplary process of making the tearband of FIGS. 1 and 2; and FIGS. 4A and 4B illustrate the preferred tearband lap-joint used in the hermetically sealed assembly of FIG. 1.

DETAILED DESCRIPTION OF THE PRESENTLY PREFERRED EMBODIMENT

As shown in FIG. 1, a split aircraft instrument housing assembly 6 typically contains indicator electronic equipment. The case subassembly 5 is typically a cylindrical chamber having an open recessed end 13 which fits within a recessed lip 12 of end plate subassembly 4 so that, when joined, case subassembly 5 and endplate subassembly 4 form a recessed groove 7 at their abutting joint. A foil-backed acrylic transfer adhesive tearband 1 disposed within groove 7 structurally joins and hermetically seals the case subassembly 5 and end-plate subassembly 4 as an integral housing unit 6 by adhesively attaching to each of the sub-assemblies at their abutting joints.

The gas pressure within the interior volume of the split housing indicator assembly is typically substantially one atmosphere. Thus, when subjected to high altitude, low pressure ambient environments, approximately 15 pounds per square inch of force is exerted against the end of case assembly 5' in the −X direction and the end of end plate assembly 4' in the +X direction (as shown in FIG. 1). The width of the foil-backed acrylic transfer adhesive tearband should be wide enough to withstand such shear forces. The greater the surface area of the end of case assembly 5' and the end of end plate assembly 4' the wider the adhesive surface area of the adhesive tearband must be. That is, approximately one-half the acrylic transfer adhesive width is adhered to each case subassembly and such half-width must be able to withstand the expected shear forces (in the −X and +X direction) exerted against opposite ends of the case assembly 5' and end plate assembly 4'.

Foil-backed acrylic adhesive tearband 1 may be formed in a roll (FIG. 3) having paper backing 8, an acrylic transfer adhesive layer 3, and a metallic foil layer 2 typically comprised of nickel (e.g. annealed) or aluminum (or other metal compatible with the exterior metallic surface of the split housing assembly 6).

Tearband 1 is applied to the case subassemblies 4, 5 (after their mechanical juxtaposition) in a relatively easy fashion by merely removing the adhesive paper cover backing 8 and applying the tearband 1 like a tape (under tension) in a circumferential loop around the split housing assembly within recessed groove 7.

For facile installation of the indicator assembly within an airplane instrument cluster, the overall thickness of the tearband should be approximately equal to the depth of recessed groove 7 so that the finished metallic top layer 2 of tearband 1 is about flush with the exterior surface of the split housing assembly 6. Such a relationship is not an absolutely essential feature of the hermetic seal since indicator assemblies without recessed groove 7 may be also be properly sealed through the use of foil-backed acrylic transfer adhesive tearband. Recessed groove 7 is, however, also an aid in aligning the tearband with the joint to be sealed.

The tearband should be pressed to the joined case surfaces to remove any, tape lay ripples and to obtain improved adhesive wet out. The length of the foil-backed acrylic transfer adhesive tearband 1 in the exemplary embodiment slightly exceeds the circumference of recessed groove 7 (as shown in FIGS. 4A and 4B) so that the ends of the foil-backed acrylic transfer adhesive tearband 1' and 1" overlap. Mere overlapping might form a gap 20 between acrylic adhesive layer 3 and the surface of groove 7 as shown in FIG. 4A. However, when the overlapping ends of the tearband 1' and 1" are suitably pressed together, the pressure sensitive acrylic transfer adhesive layer 3 deforms and becomes molded to fill the gap 20 (as shown in FIG. 4B) thus forming a truly sealed joint 21 which completes a hermetic seal for split housing assembly 6.

Additionally, prior to tearband application, mated fastening screws or shear pins (not shown) may be mounted through the recessed lip of one or both of the end plates so as to add shear strength to the finally resulting hermetic seal. However, such screws or pins or the like are often not necessary to achieve the desired aforementioned hermetic seal.

In FIG. 2 a more detailed illustration of the adhesive tearband itself is shown. The width W of the tearband 1 should correlate to the surface area of end plate subassembly 4' (FIG. 1) and case subassembly 5' (FIG. 1) as previously discussed so as to accommodate expected shear forces. Additionally the width of the recessed groove 7 should be wide enough to accommodate the tearband (typically a few thousandths of an inch clearance is provided on either side of the groove). Tearband widths of 0.375, 0.500 and 1.000 inches have been successfully tested for different housings. A width of 0.5 inch is presently preferred for 2 inch diameter housings.

The presently preferred thickness T or depth of the metal foil (when comprised of nickel) is typically on the order of about 0.003 inch. When the foil is comprised of aluminum, the presently preferred thickness of the foil is typically on the order of 0.005 inch.

The presently preferred thickness of the acrylic transfer adhesive layer 3 is typically on the order of 0.005 inch. Thicknesses of 0.002 inch and 0.010 inch have been tested and found to be inferior to the 0.005 inch thickness. The acrylic transfer adhesive is commercially available in rolls and is already covered on one side with protective paper backing 8 which may be removed just prior to applying the tearband 1 to the joint 13 to be sealed.

As shown in FIG. 3, foil-backed acrylic adhesive tearband 1 may be formed from a commercially available roll 30 of acrylic adhesive transfer layer 3 typically already having a paper backing layer 8. As roll 30 is unrolled, it may be uniformly pressed and thus adhered to an appropriate length of metalic foil strip 2. The foil strip 2 is preferably cleaned, on at least the surface to be mated with acrylic adhesive layer 3, with methylethyl ketone, alcohol, or other suitable oil-cleaning solvent. The metalic foil strip, of course, may also be initially formed in a roll and thus the acrylic transfer adhesive layer 3 may be unrolled from roll 30 simultaneous with the unrolling of and pressing together (as indicated by arrows 32, 34) with cleaned metallic foil layer 2. A roller (or pair of rollers) or the like (or a suitable press) may be used to generate forces 32, 34 as will be appreciated.

Attachment of acrylic transfer adhesive layer 3 to metallic foil layer 2, as in FIG. 3, prior to sealing of split housing assembly 6 permits the already attached metallic foil layer 2 to act as an alignment tool in manually applying the adhesive layer 3 within groove 7. Other nonmanual methods (such as in automated systems having suitable servo alignment mechanisms) could instead first apply the acrylic transfer adhesive layer 3 to recessed groove 7 and, simultaneously or subsequently, apply metallic foil layer 2. The acrylic transfer adhesive also may be applied manually to the joint in a first step (before adding the foil layer 2) as described in the preceding sentence; however, such a method is believed to be more tedious and to cause greater error than the preferred FIG. 3 technique wherein the acrylic transfer adhesive layer 3 is first joined to metallic foil layer 2 and then the resulting tearband 1 is applied within recessed groove 7.

In the above described fashion, split housing assemblies may be hermetically sealed without the use of soldered copper strips.

The foregoing description and the accompanying drawings are believed to clearly disclose a presently preferred exemplary embodiment of the present invention but it will be understood that this disclosure is merely illustrative and that changes in the invention may be made as are fairly within the scope and spirit of the following claims.

What is claimed is:

1. A hermetically sealed and structurally joined split aircraft instrument housing assembly made of at least two parts having abutting edges, said assembly comprising:
   two adjacent chamber subassemblies forming an abutting joint of their edges;
   a metallic foil strip of predetermined thickness; and
   an acrylic transfer adhesive strip of predetermined thickness adhesively affixed to one side of said metallic foil strip thereby forming a tearband;
   said tearband being adhesively attached, through said acrylic transfer adhesive, to each of said subassemblies about said abutting joint whereby said split housing assembly is assembled and substantially hermetically sealed and structurally joined.

2. A hermetically sealed assembly as claimed in claim 1 wherein said subassemblies each include a recessed lip adjacent said abutting joint which collectively define a recessed groove and wherein said tearband is disposed within said recessed groove.

3. A hermetically sealed assembly as claimed in claim 1 wherein said metallic foil comprises aluminum.

4. A hermetically sealed assembly as in claim 3 wherein said foil is on the order of about 0.005 inch thick.

5. A hermetically sealed assembly as claimed in claim 1 wherein said metallic foil comprises nickel.

6. A hermetically sealed assembly as in claim 5 wherein said foil is on the order of about 0.003 inch thick.

7. A hermetically sealed assembly as in claim 1 wherein said foil is on the order of about 0.003 inch thick.

8. A hermetically sealed assembly as in claim 6 wherein said acrylic transfer adhesive is between 0.002 inch thick and 0.010 inch thick.

9. A hermetically sealed assembly as in claim 7 wherein said acrylic transfer adhesive is on the order of about 0.005 inch thick.

10. A hermetically sealed assembly as in claim 8 wherein said acrylic transfer adhesive is on the order of about 0.005 inch thick.

11. A method for the hermetic sealing of a split aircraft instrument housing assembly, made of at least two parts with abutting edges, said method comprising:
   assembling said parts to form said assembly with a joint at said abutting edges; and
   placing a strip of metallic foil-backed with an acrylic transfer adhesive, about said joint so as to also adhesively affix said acrylic transfer adhesive to said parts on all sides of said joint whereby said housing assembly is substantially hermetically sealed and structurally joined.

12. A method as in claim 11 wherein said placing step includes fitting said strip into a recessed groove formed at said abutting edges.

13. A split aircraft instrument housing assembly having a foil-backed acrylic transfer adhesive tearband for the hermetic sealing and structural joining of said split aircraft instrument housing assembly, said assembly having juxtaposed abutting edges, said tearband comprising:
   a metallic foil strip;
   an acrylic transfer adhesive layer adhesively affixed on one side to said foil layer; and
   a protective peelable layer temporarily affixed to the other side of said acrylic transfer adhesive layer, thereby forming said tearband so that when said protective layer is removed and said tearband is adhesively affixed to said abutting edges, said assembly is substantially hermetically sealed and structurally joined.

14. An assembly as claimed in claim 13 wherein said metallic foil comprises nickel which is about 0.003 inch thick and wherein said acrylic transfer adhesive layer is about 0.005 inch thick.

15. An assembly as claimed in claim 13 wherein said metallic foil comprises aluminum which is about 0.005 inch thick and wherein said acrylic transfer adhesive layer is about 0.005 inch thick.

16. An assembly as claimed in claim 13 wherein said acrylic transfer adhesive is capable of maintaining a substantially hermetic seal between $-65°$ F. and $300°$ F. and at pressure differentials up to one atmosphere between the inside and outside of said housing assembly.

* * * * *